(12) United States Patent
Chung et al.

(10) Patent No.: US 6,207,478 B1
(45) Date of Patent: Mar. 27, 2001

(54) METHOD FOR MANUFACTURING SEMICONDUCTOR PACKAGE OF CENTER PAD TYPE DEVICE

(75) Inventors: Myung Kee Chung; Jin Soon Lee; Ho Tae Jin, all of Cheonan; In Pyo Hong, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/333,772

(22) Filed: Jun. 15, 1999

(30) Foreign Application Priority Data

Jul. 18, 1998 (KR) .................................................. 98-28997

(51) Int. Cl.⁷ ........................... H01L 21/44; H01L 21/48; H01L 21/50
(52) U.S. Cl. .......................... 438/124; 438/106; 438/118; 438/121; 438/125; 438/126; 438/127
(58) Field of Search ..................................... 438/106, 118, 438/121, 124, 125, 126, 128

(56) References Cited

U.S. PATENT DOCUMENTS 6,103,554 * 8/2000 Son et al. .............................. 438/126

* cited by examiner

Primary Examiner—John F. Niebling
Assistant Examiner—David Zarneke
(74) Attorney, Agent, or Firm—Skjerven Morrill Macpherson LLP; David Millers

(57) ABSTRACT

In accordance with an embodiment of the present invention, a method for manufacturing a semiconductor package of a center pad type device includes: attaching a semiconductor chip to a tape wiring substrate where the chip has bonding pads along a center line of its active surface and the substrate has multiple beam leads; interposing an elastomer between the semiconductor chip and the tape wiring substrate; bonding the beam leads to the respective bonding pads exposed through an opening of the elastomer; and encapsulating the opening and a perimeter of the semiconductor chip with a liquid encapsulant. The method may use a cover film. When the cover film is used, the encapsulation can be done in two ways. In one way, an encapsulant is dispensed on a portion of tape wiring substrate that is close to one end of the opening of the elastomer. The encapsulant is then dispensed along a perimeter of the semiconductor chip. In the other way, the cover film has a number of air vents, and an encapsulant is dispensed at both ends of the opening as well as along the perimeter of the semiconductor chip. In the both ways, the encapsulation may be performed under vacuum. When the cover film is not used, an encapsulant is dispensed in the opening of the elastomer through an opening of the tape wiring substrate. The tape wiring substrate is then turned upside down, and the encapsulant is dispensed along a perimeter of the semiconductor chip.

10 Claims, 10 Drawing Sheets

METHOD FOR MANUFACTURING SEMICONDUCTOR PACKAGE OF CENTER PAD TYPE DEVICE

BACKGROUND OF THE INVENTION

1. Field of the Invention

The present invention generally relates to a method for manufacturing a semiconductor device package, and more particularly for manufacturing a semiconductor package of a center pad type device.

2. Description of the Related Arts

New packaging technologies have emerged to meet the integration density and operation speed requirements of newly developed semiconductor devices. The new packaging technology includes the Ball Grid Array (BGA) package, the Chip Size Package (CSP) and the Fine Pitch Ball Grid Array (FPBGA) package. While all of these packages have a smaller footprint than conventional plastic packages, the footprint of the CSP and FPBGA packages can be as small as the size of the semiconductor chip.

FPBGA packages 10 and 20 are described with reference to FIGS. 1 and 2. As shown in FIG. 1, a semiconductor chip 11 is attached to a tape wiring substrate 15. An elastomer 16 is interposed between semiconductor chip 11 and tape wiring substrate 15. Tape wiring substrate 15 includes a polyimide film 13 having top and bottom surfaces, beam leads 14 formed on the bottom surface of polyimide film 13, and terminal pads 4 which are extensions of beam leads 14. Multiple via holes 17, through which terminal pads 4 are exposed, are formed through polyimide film 13. Metal balls 19 are attached to terminal pads 4. Beam leads 14 are bonded to bonding pads 12 of semiconductor chip 11. As a result, semiconductor chip 11 electrically connects to external electronics (not shown) through bonding pads 12, beam leads 14, terminal pads 4, and metal balls 19. Bonding parts between bonding pads 12 and beam leads 14 are encapsulated with a plolymer resin 18.

The bonding pads of memory devices are typically arranged along the outer edges of the devices. The bonding pads of semiconductor chip 11 of FPBGA package 10 are arranged in this fashion.

To improve electrical performance and reduce the size of the chip, a center pad type memory device was created in which the bonding pads are disposed along a center line(s) of the device. The center pad type memory device requires a newly designed FPBGA package.

FPBGA package 20 of FIG. 2 is an example of the FPBGA package designed for the center pad type device. As with FPBGA package 10 of FIG. 1, a semiconductor chip 21 is attached to a tape wiring substrate 25. An elastomer 26 is interposed between semiconductor chip 21 and tape wiring substrate 25. Via holes 27 are formed through the tape wiring substrate 25. Beam leads 24a of tape wiring substrate 25 bond to bonding pads 22 of semiconductor chip 21. Metal balls 29 are attached to respective terminal pads 24b exposed through via holes 27. Although FPBGA package 20 looks similar to FPBGA package 10, FPBGA package 20 presents some technical problems not found in FPBGA package 10.

Encapsulation of edge encapsulation area 28a is performed by the same method as the encapsulation of FPBGA package 10. Before solder balls 29 are attached to terminal pads 24b, a cover film (not shown) is attached to the top surface of tape wiring substrate 25. Tape wiring substrate 25 and chip 21 are turned upside down such that the cover film is under tape wiring substrate 25. A liquid encapsulant is then dispensed on tape wiring substrate 25 along the perimeter of semiconductor chip 21 to encapsulate edge encapsulation area 28a. Encapsulation of a center encapsulation area 28b is performed after turning over the tape wiring substrate 25 and removing the cover film.

The encapsulation process of FPGBA package 20 is long and complicated, and, consequently, increases manufacturing costs. Because encapsulation area 28b may trap an air pocket and the void of the air pocket may result in a crack in the packaging, the encapsulation process decreases the FPGBA package's reliability.

SUMMARY OF THE INVENTION

In accordance with an embodiment of the present invention, a method for manufacturing a semiconductor package of a center pad type device includes: a semiconductor chip with bonding pads along a center line of its active surface; attaching the semiconductor chip to a tape wiring substrate having multiple beam leads; interposing an elastomer between the semiconductor chip and the tape wiring substrate; bonding the beam leads to the respective bonding pads which are exposed through an opening of the elastomer; and encapsulating the opening and perimeter of the semiconductor chip with a liquid encapsulant. The tape wiring substrate includes both a number of terminal pads, which are extensions of the beam leads, and via holes through which the terminal pads are exposed. After the encapsulation, metal balls are attached to the terminal pads.

The method may use a cover film. When the cover film is used, there are two techniques for encapsulating the elastomer's opening. Using one technique, an encapsulant is dispensed on a portion of tape wiring substrate that is close to one end of the opening. The encapsulant is dispensed along the semiconductor chip's perimeter. Using the second technique, the cover film includes a number of air vents. The encapsulant is dispensed at both ends of the opening and along the semiconductor chip's perimeter.

In both techniques, the encapsulation may be performed in a vacuum. It is preferable that the encapsulant have a viscosity of about 60 to 130 poises.

When the cover film is not used, an encapsulant is dispensed in the opening of the elastomer through an opening of the tape wiring substrate. The tape wiring substrate is then turned upside down, and the encapsulant is dispensed along the semiconductor chip's perimeter. It is preferable that the encapsulant be first-cured after filling the opening and be second-cured after filling the perimeter of the semiconductor chip.

In order to produce a number of semiconductor packages simultaneously, a base substrate including multiple tape wiring substrates can be fixed to a frame and undergo the methods described above. In a final step, the tape wiring substrate is separated to produce individual semiconductor packages.

BRIEF DESCRIPTION OF THE DRAWINGS

The features and advantages of the present invention will be readily understood with reference to the following detailed description taken in conjunction with the accompanying drawings, in which like reference numerals designate like structural elements, and in which.

DETAILED DESCRIPTION OF THE PREFERRED EMBODIMENTS

Figure 1:
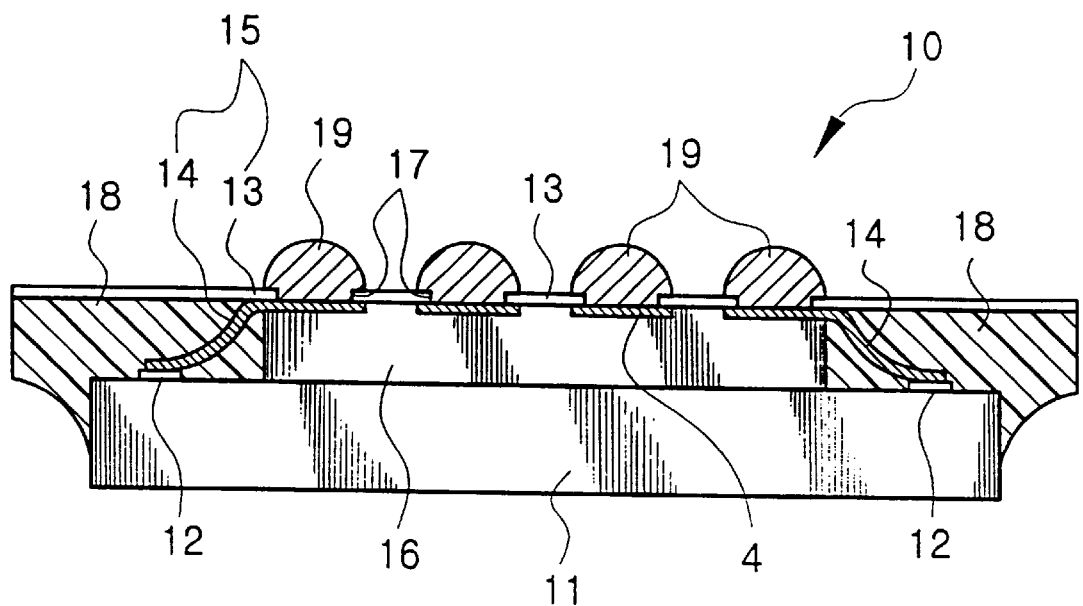
FIG. 1 is a cross-sectional view of a conventional FPBGA package of an edge pad type device.
Figure 2:
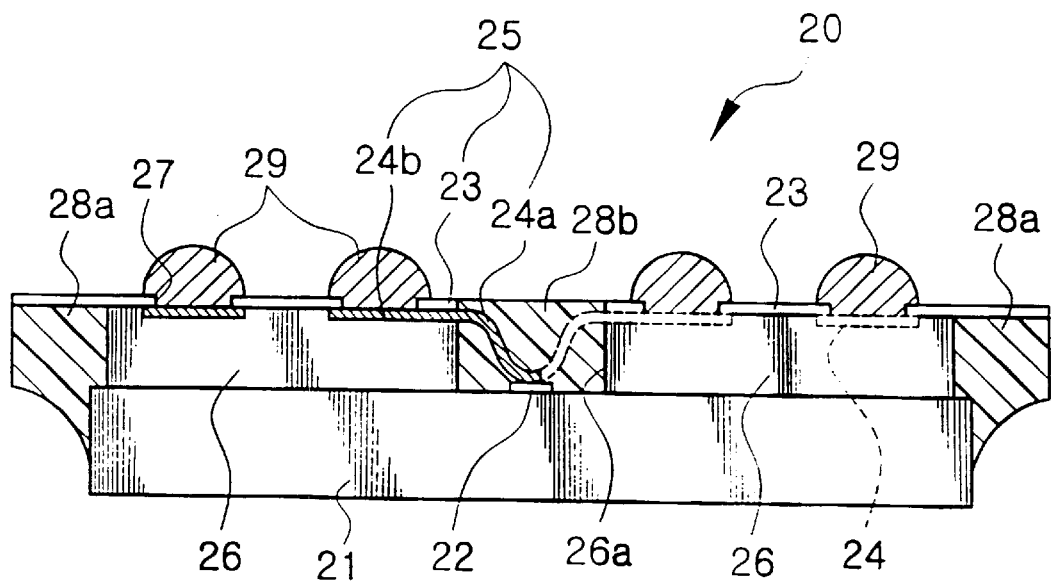
FIG. 2 is a cross-sectional view of a conventional FPBGA package of a center pad type device.
Figure 3:
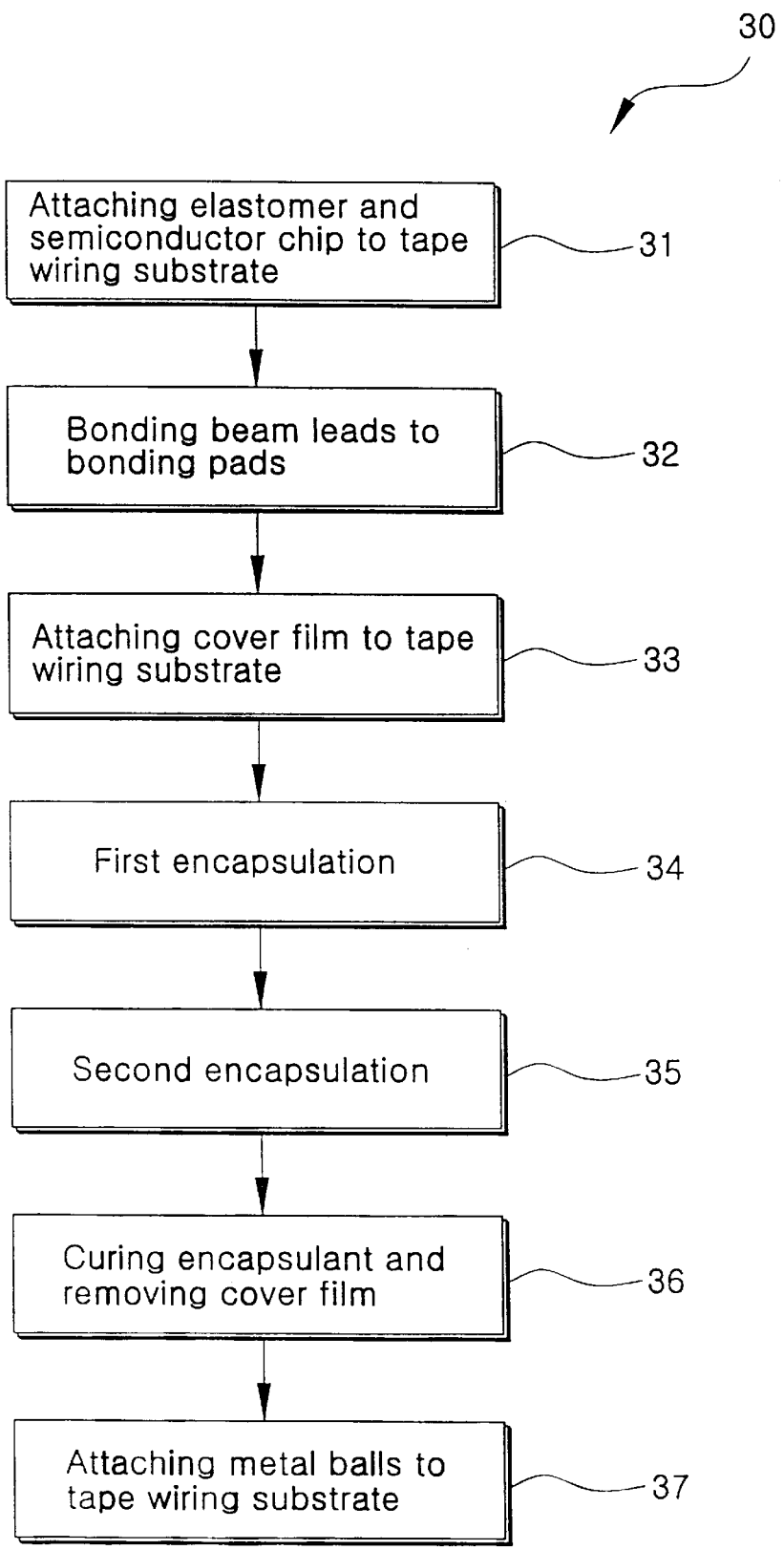
FIG. 3 is a flowchart of a method 30 for manufacturing a semiconductor package of a center pad type device, according to an embodiment of the present invention.

FIG. 3 is a flowchart of a method 30 for manufacturing a FPBGA semiconductor package of a center pad type device according to an embodiment of the present invention. The semiconductor package has a configuration similar to that of FPBGA package 20 of FIG. 2.

Referring to FIG. 3, the method 30 begins with attaching a semiconductor chip to a tape wiring substrate by interposing an elastomer between the semiconductor chip and the tape wiring substrate (step 31). A conventional single point bonding machine then bonds beam leads of the tape wiring substrate to respective bonding pads of the semiconductor chip (step 32). Before encapsulating the semiconductor package, a cover film is attached to a top surface of the tape wiring substrate (step 33). A first-encapsulation (step 34) encapsulates the bonding area. A second-encapsulation (step 35) encapsulates the perimeter of the semiconductor chip with an encapsulant. After the encapsulation (steps 34 and 35), the encapsulant is cured, and the cover film is removed is from the tape wiring substrate (step 36). Finally, metal balls are attached to the tape wiring substrate (step 37).

Figure 4:
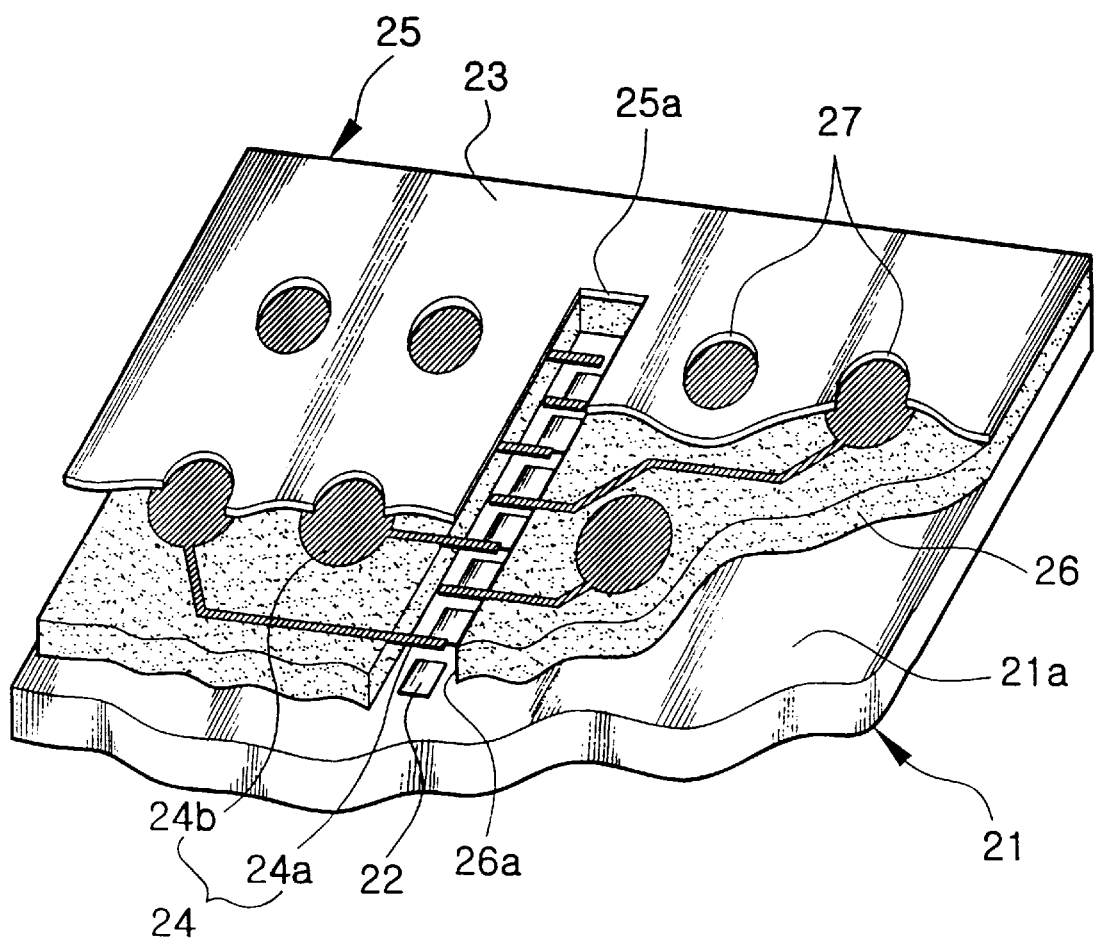
FIG. 4 is a perspective view of a semiconductor package depicting the step of attaching a semiconductor chip to the tape wiring substrate of FIG. 3.

Method 30 is explained in detail with reference to FIGS. 3 to 7. FIG. 4 depicts the attaching step (step 31) of FIG. 3.

In FIG. 4, an elastomer 26, which is widely used for chip scale packages, I particular, for $\mu$TBGA packages, is interposed between a semiconductor chip 21 and a tape wiring substrate 25. The elastomer films, such as models 'X20' and 'X21' manufactured by Hitachi Chemical of Japan, are suitable for elastomer 26. Bonding pads 22 form along a center line of an active surface 21a of semiconductor chip 21. Elastomer 26 attaches to active surface 21a of semiconductor chip 21 such that bonding pads 22 of semiconductor chip 21 are exposed through an opening 26a of elastomer 26. Tape wiring substrate 25 is then attached to elastomer 26. Tape wiring board 25 includes a polyimide film 23, an opening 25a corresponding to opening 26a of elastomer 26, and wiring patterns 24 patterned on a bottom surface of polyimide film 23. Each wiring pattern 24 includes a beam lead 24a which is exposed through openings 25a and a terminal pad 24b. Tape wiring substrate 25 further includes multiple via holes 27 to expose terminal pads 24b.

Tape wiring substrate 25 may further include an adhesive layer (not shown) on its bottom surface to promote the attachment between tape wiring substrate 25 and elastomer 26. A conventional die-bonding machine having a thermode can perform FIG. 3, step 31.

Figure 5:
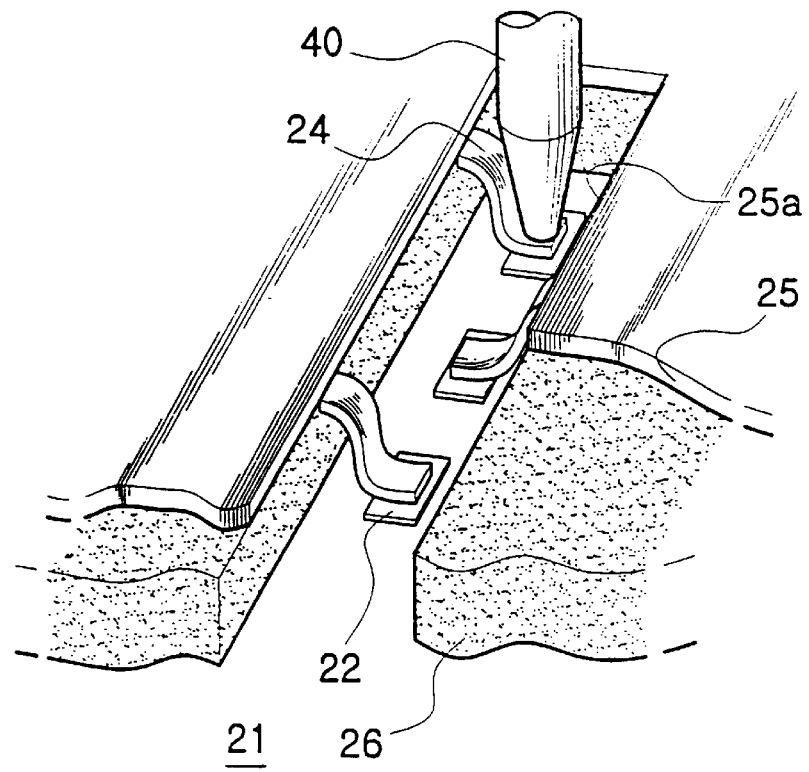
FIG. 5 is a perspective view of a semiconductor package depicting the step of bonding beam leads to bonding pads of the semiconductor chip of FIG. 3.

FIG. 5 depicts FIG. 3, step 32. In FIG. 5, beam leads 24a of tape wiring substrate 25 bond to respective bonding pads 22 of semiconductor chip 21. A bonding tool 40 of a conventional single point bonder presses beam leads 24a one by one through opening 25a of tape wiring substrate 25.

Figure 6:
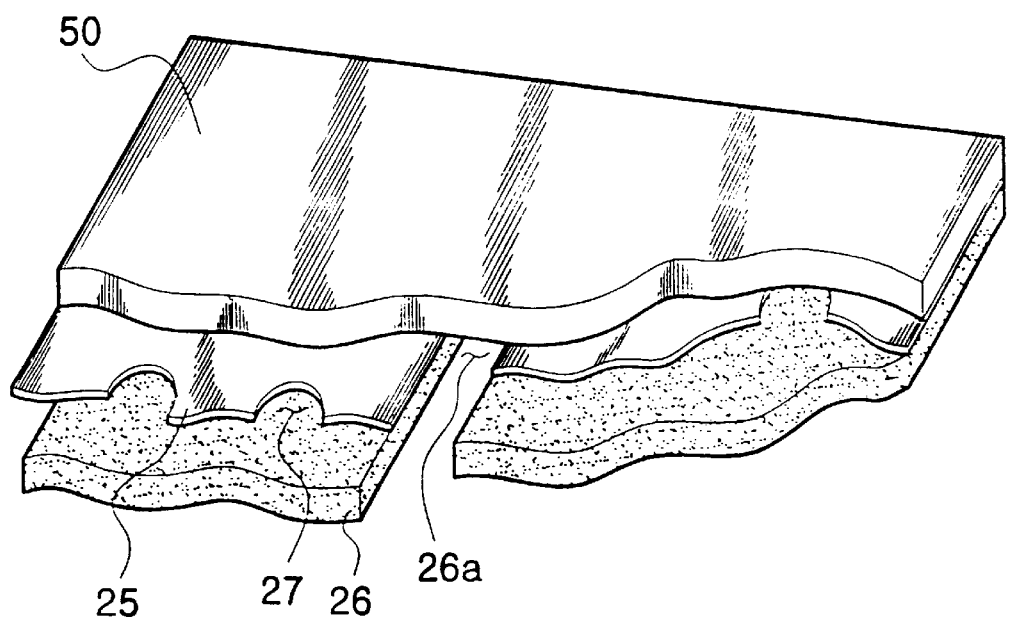
FIG. 6 is a perspective view of a semiconductor package depicting the step of attaching a cover film to the tape wiring substrate of FIG. 3.

FIG. 6 depicts FIG. 3, step 33, which attaches a cover film 50 to a top surface of tape wiring substrate 25. The cover film 50 serves to prevent an outflow of a liquid encapsulant during subsequent encapsulation (FIG. 3, steps 34 and 35). For cover film 50, model '3198MS' manufactured by Nitto Denko of Japan can be used.

After step 33, and before step 34, tape wiring substrate is turned upside down.

Figure 7:
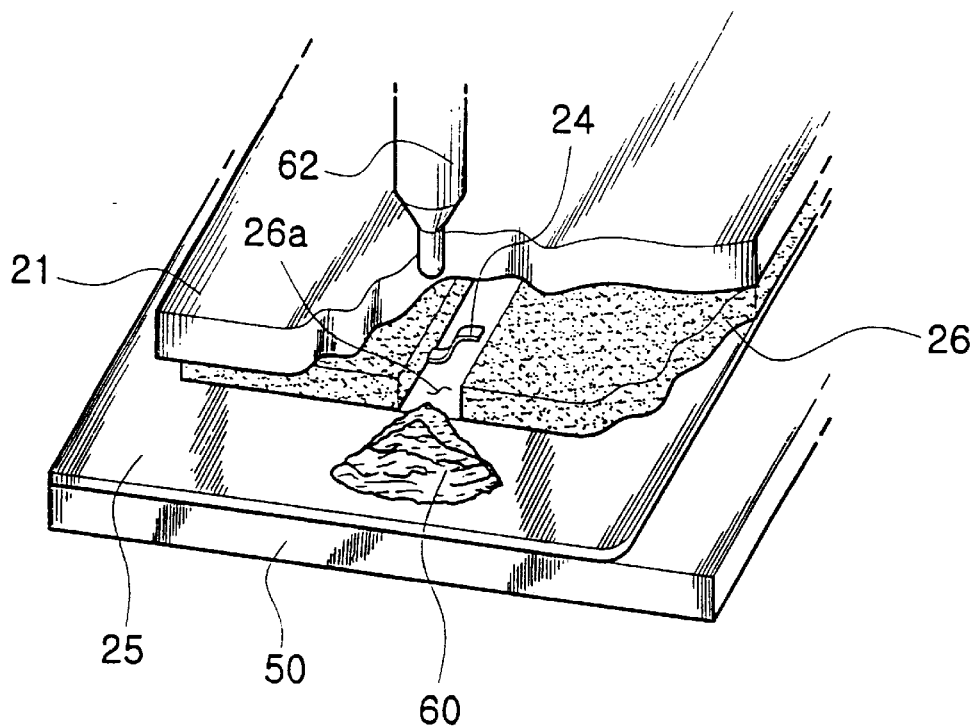
FIG. 7 is a perspective view of a semiconductor package depicting the encapsulating steps of FIG. 3.

FIG. 7 depicts FIG. 3, step 34, during which a dispenser 62 dispenses a liquid encapsulant 60 on a portion of tape wiring substrate 25. The liquid encapsulant 60 is dispensed on tape wiring substrate 25 very close to one end of opening 26a of elastomer 26. Since opening 26a is narrow, encapsulant 60 flows from one end of opening 26a and fills opening 26a by capillary action.

In the first encapsulation step, filling time of opening 26a depends on the size of semiconductor chip 21 (that is, the size of opening 26a) and the viscosity of encapsulant 60. For example, when opening 26a is about 14 mm long, an encapsulant with a viscosity of about 620 poises fills opening 26a in about 12 hours. An encapsulant with a viscosity of about 130 poises fills opening 26a in approximately 30 minutes. In addition, the first encapsulation can be performed in a vacuum to reduce the encapsulant filling time.

As depicted in FIG. 7, encapsulant 60 fills opening 26a from one end of opening 26a. Air in opening 26a can escape through the other end of opening 26a. Thus no air is trapped in the encapsulated opening 26a, and no void is formed.

In the second encapsulation step, encapsulant 60 is again dispensed on tape wiring substrate 25 along a perimeter of semiconductor chip 21 so that encapsulant 60 covers side surfaces of elastomer 26 and semiconductor chip 21. Like first encapsulation step 34, step 35 can be performed under vacuum to reduce encapsulation time.

After step 35, encapsulant 60 is cured, and cover film 50 is removed from tape wiring substrate 25. Terminal pads 24b are exposed through via holes 27. A film that loses its adhesion strength when heated can be used for cover film 50.

After removing the cover film, flux is applied on terminal pads 24*b*, and the metal balls are placed on terminal pads 24*b*. Reflow soldering then attaches the metal balls to terminal pads 24*b*. A mask may be used for correct placement of the metal balls. The metal balls are preferably made of solder alloys. Instead of the metal balls, metal paste may be attached to terminal pads 24*b*.

Figure 8:
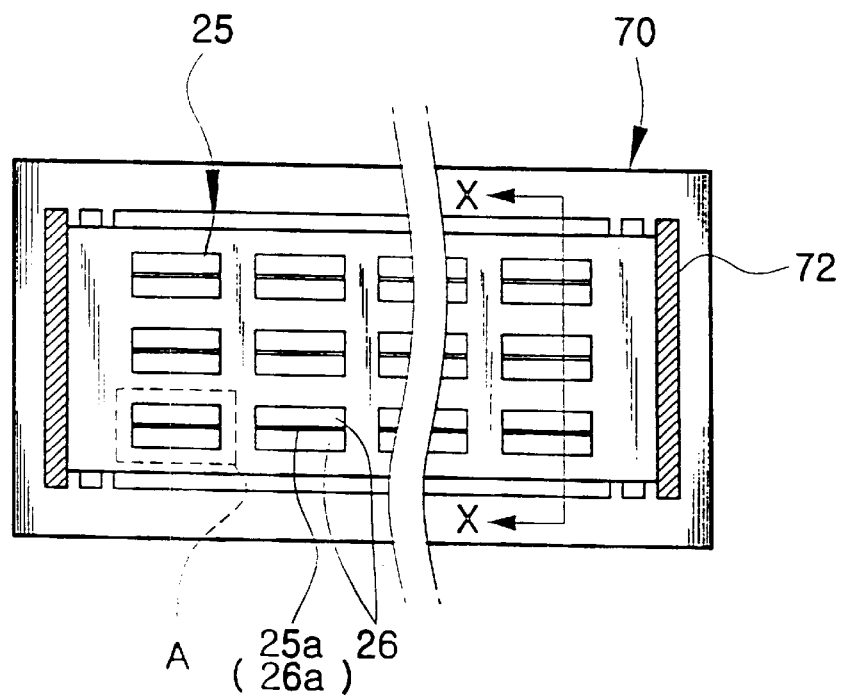
FIG. 8 is a plan view depicting the tape wiring substrate fixed to a frame.

Multiple tape wiring substrates 25 can be formed in a matrix on a base substrate as shown in FIG. 8. Two opposite sides of the base substrate can be attached to a frame 70 by an adhesive tape 72 for an improved handling of tape wiring substrates 25 in the manufacturing steps of FIG. 3. On completing the manufacturing steps, the base substrates are separated to produce individual semiconductor packages. A reference letter "A" indicates a dotted line along which tape wiring substrate 25 is cut.

Figure 9:
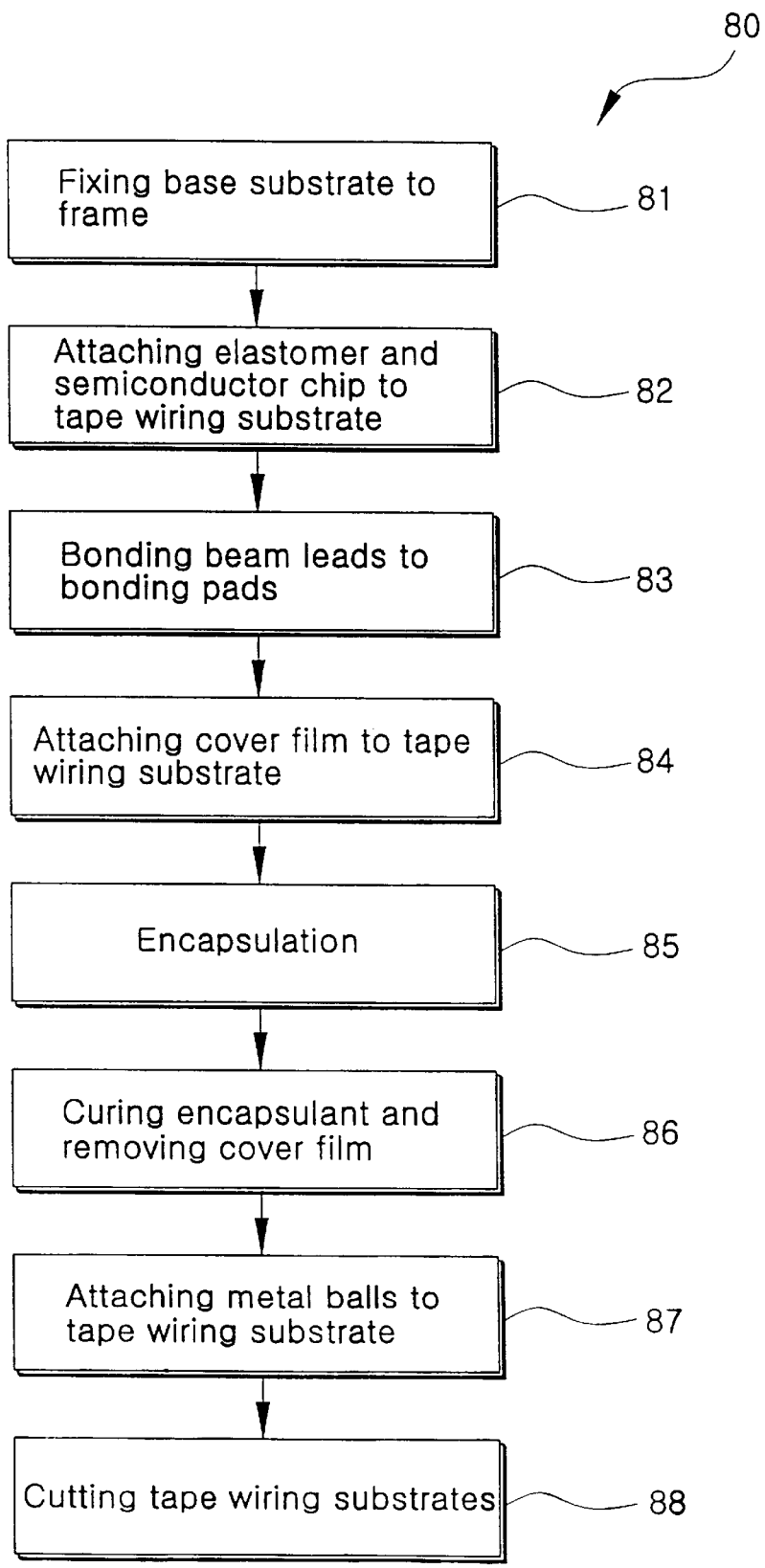
FIG. 9 is a flowchart of a method 80 for manufacturing a semiconductor package of a center pad type device, according to another embodiment of the present invention.

FIG. 9 is a flowchart of a method 80 for manufacturing a semiconductor package of a center pad type device, according to another embodiment of the present invention. Method 80 differs from method 30 of FIG. 3 in that method 80 employs a cover film having air vents.

Referring to FIG. 9, a base substrate including a number of tape wiring substrates is attached to a frame (step 81). An elastomer is then attached to the tape wiring substrate, and a semiconductor chip is attached to the elastomer (step 82). Beam leads of the tape wiring substrate are bonded to respective bonding pads of the semiconductor chip (step 83). A cover film having air vents is attached to the tape wiring substrate (step 84). Subsequent steps are similar to the steps of FIG. 3. Details of the method are described below with reference to FIGS. 10 to 13.

Figure 10:
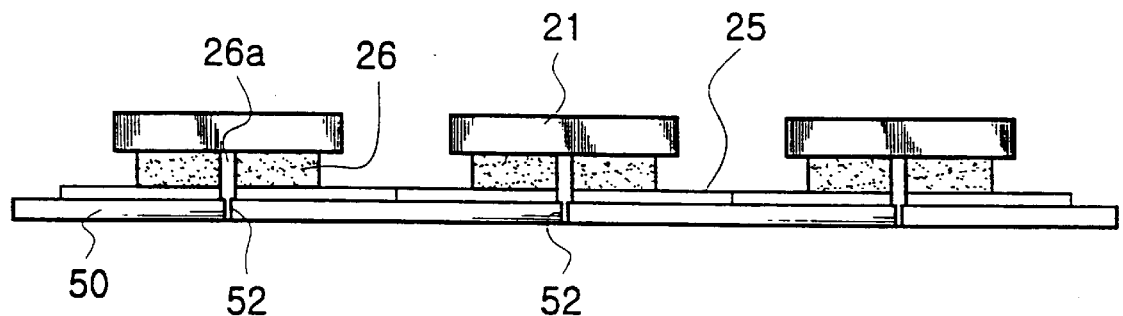
FIG. 10 is a cross-sectional view of a semiconductor chip depicting the step of attaching a cover film to a tape wiring substrate of FIG. 9.

FIG. 10 depicts the cross-section of line X—X in FIG. 8. In FIG. 10, a cover film 50 is attached to a tape wiring substrate 25 prior to an encapsulation step. Cover film 50 includes multiple air vents 52, which are formed through an area of cover film 50 corresponding to openings 26*a* of elastomers 26. When an encapsulant fills opening 26*a*, air within opening 26*a* can escape through air vents 52. As a result of the escape route created by the air vents 52, an incomplete encapsulation does not occur after the encapsulation. An overflow of the encapsulant through air vents 52 may be expected. When the liquid encapsulant has an optimum viscosity, however, and air vents 52 are very fine holes, the overflow does not occur. For a proper encapsulation, it is preferable that the width of air vent is less than 50 μm, and the viscosity of the encapsulant is 60130 poise. As the encapsulant, model '6810' or '6812' from Dow Corning of the United States can be used successfully.

Figure 11:
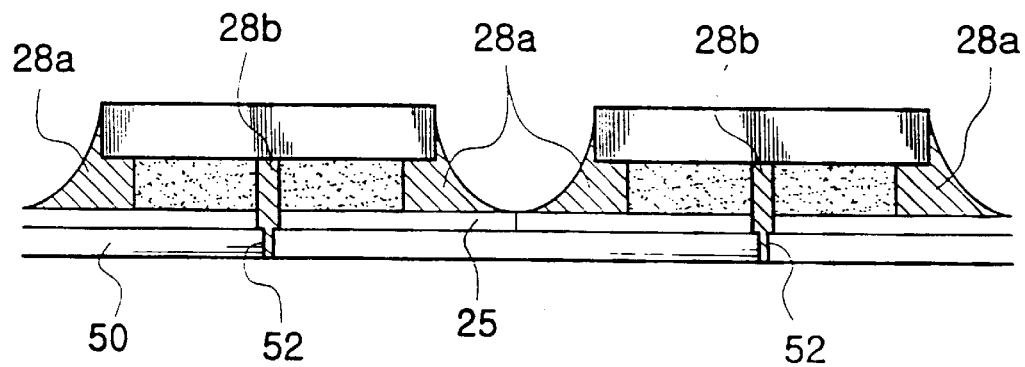
FIG. 11 is a cross-sectional view of a semiconductor chip depicting the encapsulation step of FIG. 9.

FIG. 11 depicts the cross-sectional view of FIG. 10 after the encapsulation. While method 30 of FIG. 3 includes two encapsulation steps to avoid an incomplete encapsulation, method 80 of FIG. 9 can perform the encapsulation in one step because air within openings 26*a* can escape through air vents 52 of cover film 50. In addition, air vents 52 permit the encapsulant to be dispensed simultaneously on two opposite ends of opening 26*a* without creating an incomplete encapsulation. As described with reference to FIG. 7, the first encapsulation of method 30 of FIG. 3 dispensed an encapsulant on only one end of opening 26*a*. As with method 30 of FIG. 3, encapsulation of method 80 of FIG. 9, step 85 can be performed under a vacuum.

Referring to FIG. 9, the steps of curing the encapsulated part and removing the cover film (step 86) and attaching metal balls to the tape wiring substrate (step 87) are the same as method 30 of FIG. 3, steps 36 and 37.

Figure 12:
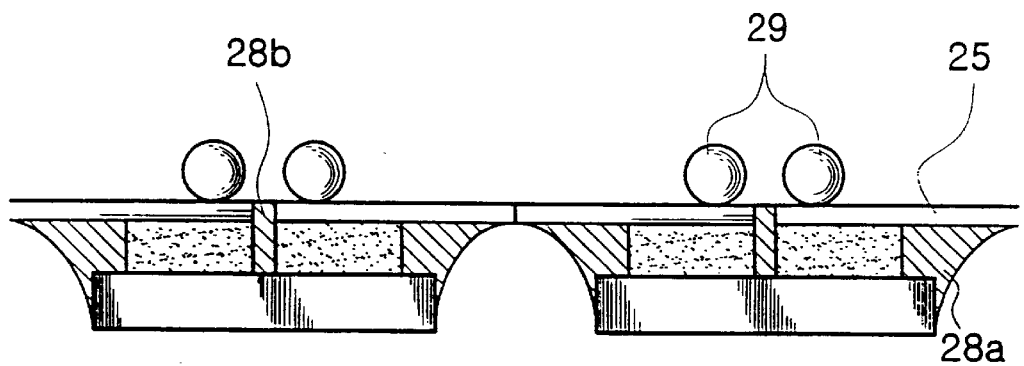
FIG. 12 is a cross-sectional view of a semiconductor chip depicting the step of attaching metal balls to the tape wiring substrate of FIG. 9.
Figure 13:
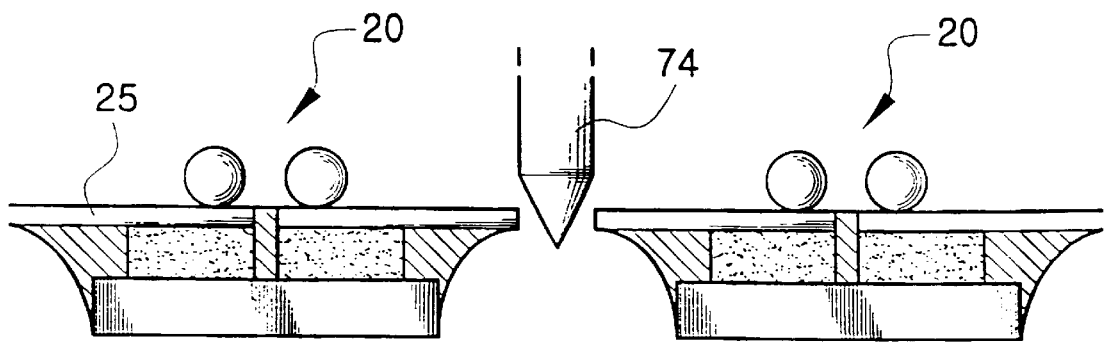
FIG. 13 is a cross-sectional view of a semiconductor chip depicting the step of separating the tape wiring substrate to form individual semiconductor packages of FIG. 9.

FIGS. 12 and 13 depict FIG. 9, step 88. As shown in FIG. 13, a cutting tool 74 separates tape wiring substrates 25 to produce individual semiconductor packages.

Figure 14:
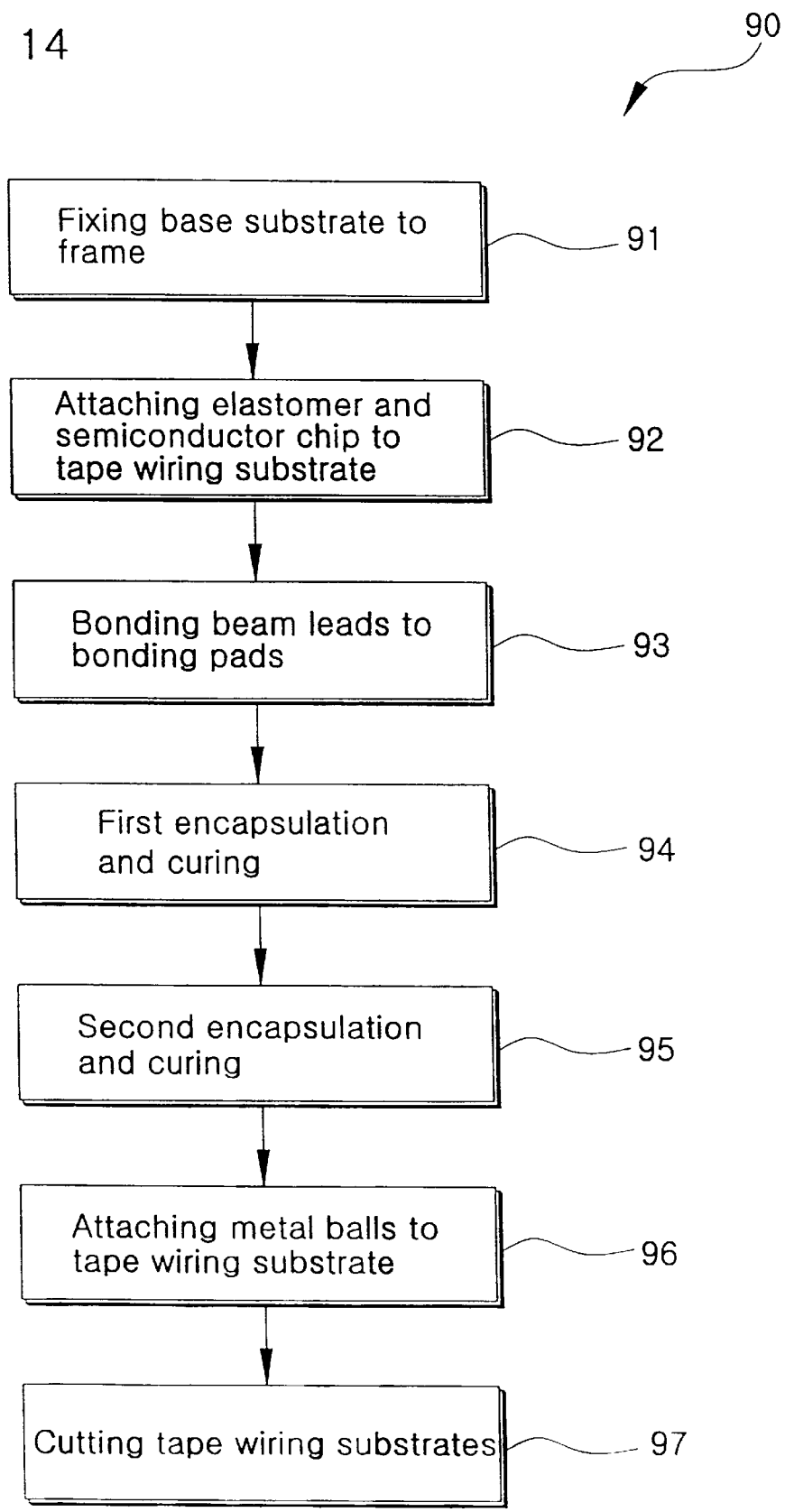
FIG. 14 is a flowchart of a method for manufacturing a semiconductor package of a center pad type device, according to yet another embodiment of the present invention.

FIG. 14 is a flowchart of a method 90 for manufacturing a semiconductor package of a center pad type device, according to another embodiment of the present invention. In its first three steps, method 90 does not differ from methods 30 and 80. Method 90 does not, however, use the cover films used in method 30, step 33, and method 80, step 84.

Figure 15:
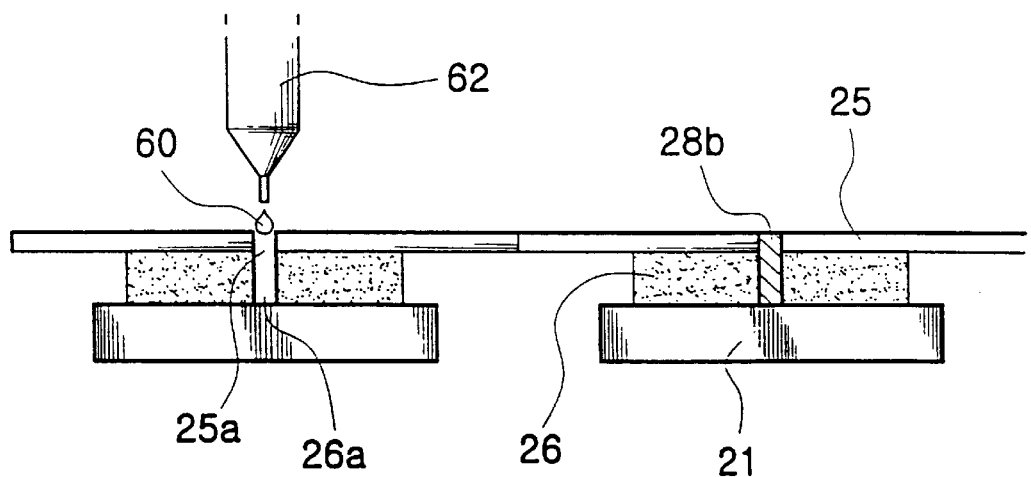
FIG. 15 is a cross-sectional view of a semiconductor chip depicting the first-encapsulation step of FIG. 14.

As shown in FIG. 14, method 90 includes a first encapsulation and curing (step 94) and a second encapsulation and curing (step 95). FIG. 15 depicts FIG. 14, step 94. As shown in FIG. 15, openings 26*a* of elastomers 26 are filled by dispensing an encapsulant 60 into openings 26*a* through openings 25*a* of tape wiring substrate 25. Dispenser 62, which has a very fine nozzle, dispenses the encapsulant 60. A conventional dispensing apparatus can perform the first encapsulation. After filling openings 26*a* of elastomers 26 to form a center encapsulation area 28*b*, the encapsulant in center encapsulation area 28*b* is cured to avoid a flow of the encapsulant into center encapsulation area 28*b*. A complete curing of the encapsulant can be done in step 95.

Figure 16:
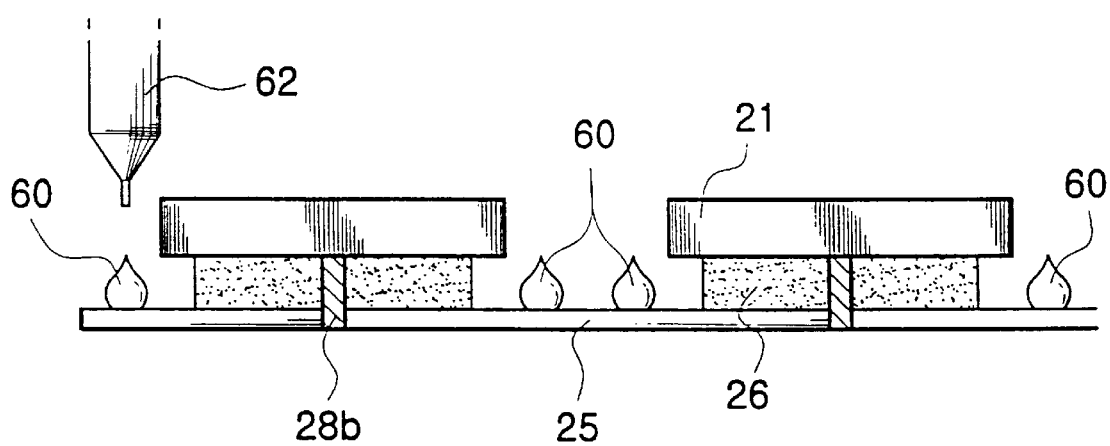
FIG. 16 is a cross-sectional view of a semiconductor chip depicting the second-encapsulation step of FIG. 14.
Figure 17:
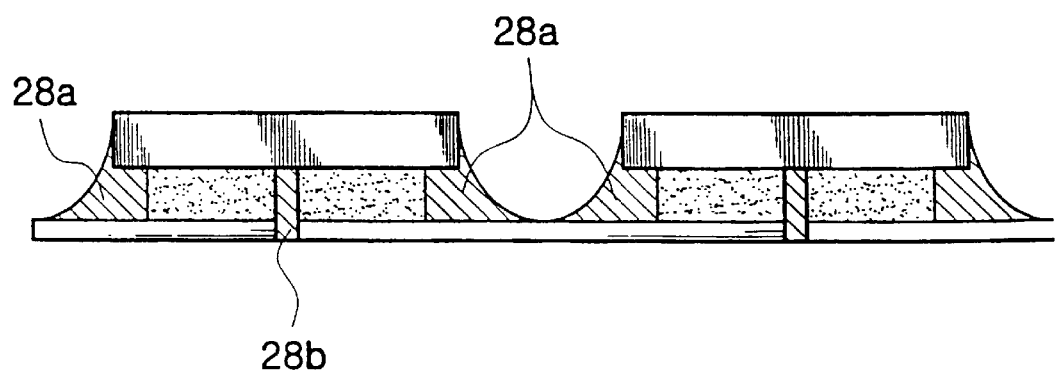
FIG. 17 is a cross-sectional view of a semiconductor chip after the second-encapsulation step of FIG. 14.

Referring to FIG. 16, after step 94, tape wiring substrate 25 is turned upside down for the second encapsulation. In step 95, dispenser 62 dispenses encapsulant 60 on tape wiring substrate 25 along a perimeter of a semiconductor chip 21, so that encapsulant 60 forms an edge encapsulation area 28*a* covering side surfaces of elastomers 26 and semiconductor chips 21. Encapsulant 60 in edge encapsulation area 28*a* and center encapsulation area 28*b* is then cured.

Under the method 90, metal balls are attached to the tape wiring substrate (step 96), and cutting tape wiring substrates produces individual semiconductor packages (step 97). Method 90, steps 96 and 97 of FIG. 14, are the same as method 80, steps 87 and 88 of FIG. 9.

In summary, the present invention can prevent incomplete encapsulation of a semiconductor package of a center pad type device and reduce encapsulation time by performing an encapsulation under a vacuum.

Although specific embodiments of the present invention have been described in detail, it should be understood that many variations and/or modifications of the basic inventive concepts taught may occur to those skilled in the art that will still fall within the spirit and scope of the present invention as defined in the appended claims.

What is claimed is:

1. A method of manufacturing a semiconductor package comprising:

(A) attaching a semiconductor chip having bonding pads along a central line on an active surface of the semiconductor chip to a tape wiring substrate, wherein an elastomer interposes between the active surface of the semiconductor chip and the tape wiring substrate, and the tape wiring substrate comprises an opening, a plurality of beam leads which are exposed through the opening of the tape wiring substrate, a plurality of terminal pads which are extensions of the beam leads, and a plurality of via holes through which the terminal pads are exposed;

(B) bonding the beam leads to the bonding pads which are exposed through the openings of the tape wiring substrate and the elastomer;

(C) attaching a cover film to a top surface of the tape wiring substrate and turning the top surface down;

(D) encapsulating the opening and side surfaces of the elastomer and the semiconductor chip with an encapsulant, wherein the encapsulating comprises:

(D-1) dispensing the encapsulant on a portion of the tape wiring substrate that is close to one end of the openings of the elastomer so that the encapsulant can flow into and fill the opening from the one end; and (D-2) dispensing the encapsulant on the tape wiring substrate along a perimeter of the semiconductor chip so that the encapsulant can cover side surfaces of the elastomer and the semiconductor chip; and (E) curing the encapsulant and removing the cover film from the tape wiring substrate.

2. The method of claim 1, further comprising (F) attaching metal balls to the terminal pads after the step (D).

3. The method of claim 1, wherein the step (D-1) is performed under vacuum.

4. The method of claim 1, wherein a viscosity of the encapsulant is about between 60 and 130 poises.

5. The method of claim 1, wherein the step (D-2) is performed under vacuum.

6. The method of claim 1, wherein the cover film has a hole through a part of the cover film that corresponds to the opening of the elastomer, so that air within the opening of the elastomer can escape through the hole during the step (D).

7. The method of claim 6, wherein the step (D) comprises dispensing the encapsulant on portions of the tape wiring board that are close to two ends of the opening of the elastomer so that the encapsulant can flow into and fill the opening from the two ends, and dispensing the encapsulant on the tape wiring board along a perimeter of the semiconductor chip so that the encapsulant can cover side surfaces of the elastomer and the semiconductor chip.

8. The method of claim 7, wherein the step (D) is performed under vacuum.

9. The method of claim 1, the step (D) comprises:

(D-i) dispensing the encapsulant directly on the opening of the elastomer through the opening of the tape wiring substrate so as to fill the opening of the elastomer; and (D-ii) turning a top surface of the tape wiring substrate down, and dispensing the encapsulant on the tape wiring substrate along a perimeter of the semiconductor chip so that the encapsulant covers side surfaces of the elastomer and the semiconductor chip.

10. The method of claim 1, further comprising fixing a base substrate which comprises a plurality of the tape wiring substrates on a frame before the step (A), and separating the tape wiring substrates from the base substrate to produce the semiconductor package after the step (D).

* * * * *